United States Patent [19]

Goetting

[11] Patent Number: 4,783,606
[45] Date of Patent: Nov. 8, 1988

[54] PROGRAMMING CIRCUIT FOR PROGRAMMABLE LOGIC ARRAY I/O CELL

[76] Inventor: Erich Goetting, 19882 Portal Pl., Cupertino, Calif. 95014

[21] Appl. No.: 38,101

[22] Filed: Apr. 14, 1987

[51] Int. Cl.⁴ .......................................... H03K 19/177
[52] U.S. Cl. .................................. 307/465; 307/363; 307/468; 307/592; 307/605
[58] Field of Search ................ 307/443, 449, 465–466, 307/468–469, 363, 592, 594, 605; 364/716

[56] References Cited

U.S. PATENT DOCUMENTS

| | | | |
|---|---|---|---|
| 4,458,163 | 7/1984 | Wheeler et al. | 307/466 |
| 4,609,838 | 9/1986 | Huang | 307/465 |
| 4,625,129 | 11/1986 | Ueno | 307/443 X |
| 4,677,318 | 6/1987 | Veenstra | 307/465 |
| 4,684,830 | 8/1987 | Tsui et al. | 307/465 |
| 4,697,097 | 9/1987 | Rusznyak | 307/363 X |
| 4,698,531 | 10/1987 | Jones | 307/592 |

Primary Examiner—Stanley D. Miller
Assistant Examiner—D. R. Hudspeth
Attorney, Agent, or Firm—Townsend & Townsend

[57] ABSTRACT

An improved architecture for programming an output cell (macro cell) in a PLD. The memory cells for the macro cell are stored in the main array itself. Upon power-up, a power-on sense circuit senses the presence of power and enables an architecture portion of the main array while disabling the rest of the main array. The power-on sense signal also enables a path from the output of the array to the macro cell elements to be programmed. When the power-on sense signal is removed a short time after power-up, this path is blocked so that the array outputs continue on their normal path and the architecture portion of the array is disabled while the rest of the array is enabled for normal operation.

13 Claims, 3 Drawing Sheets

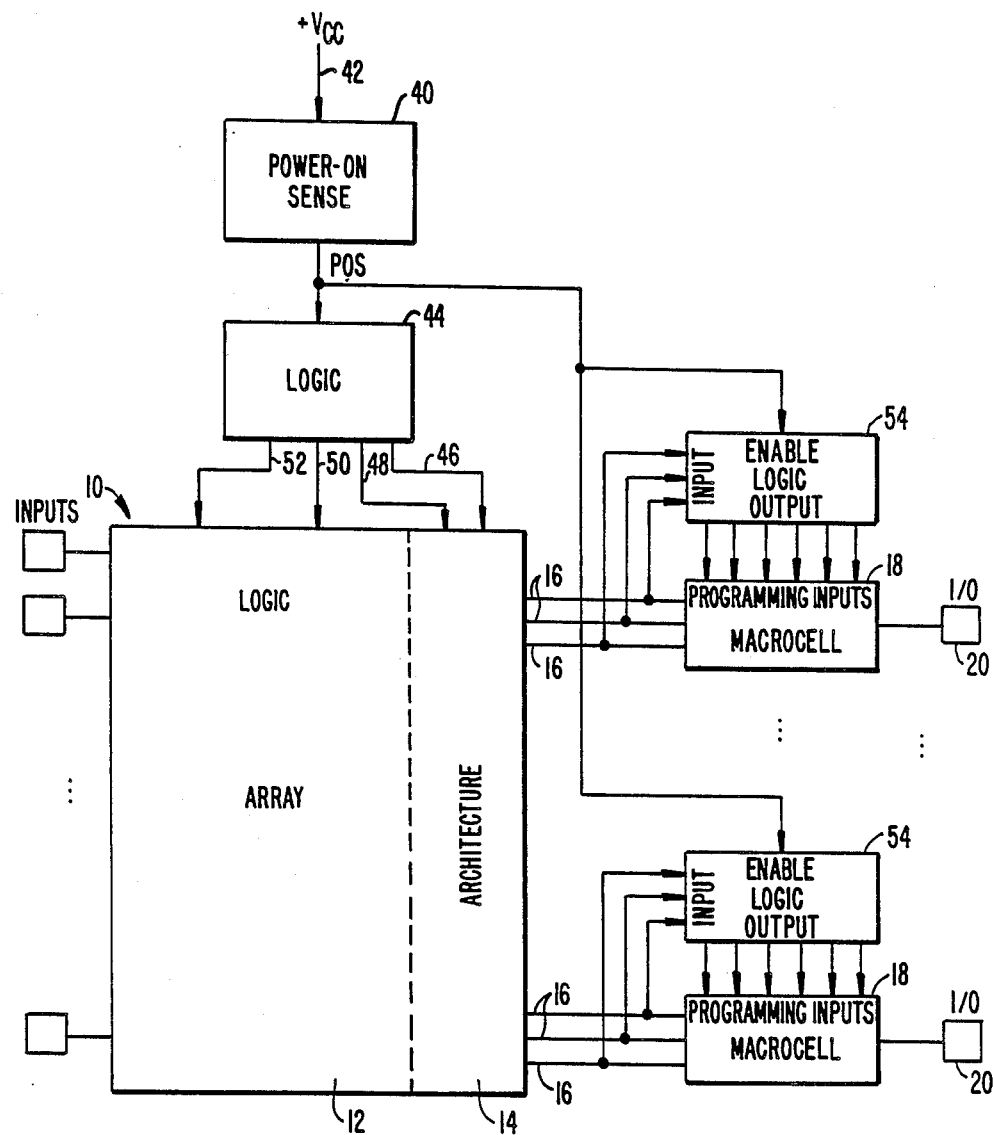
FIG._1.

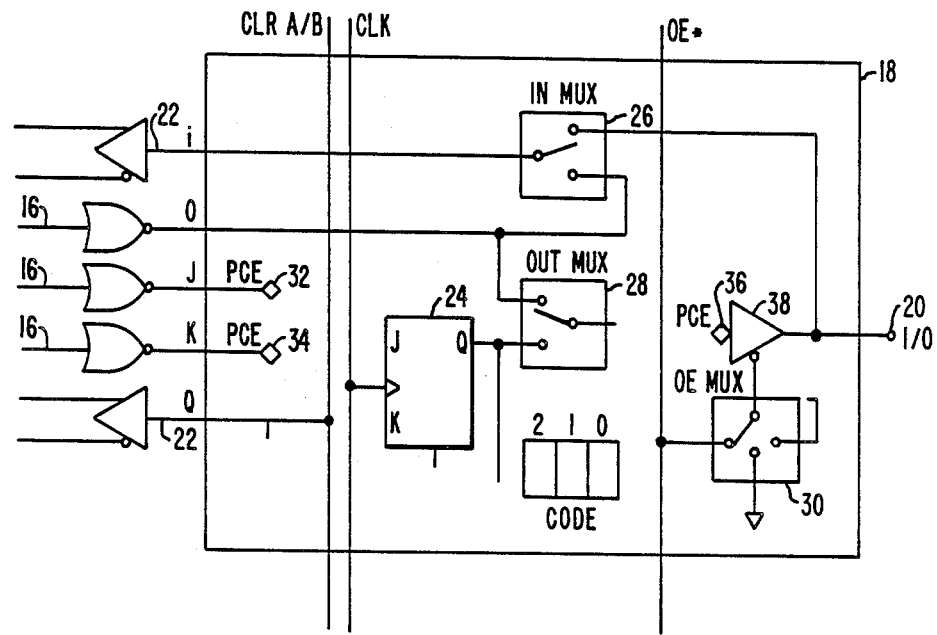
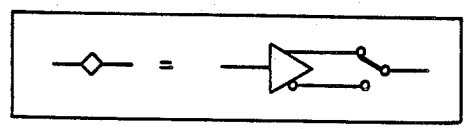
FIG._2.

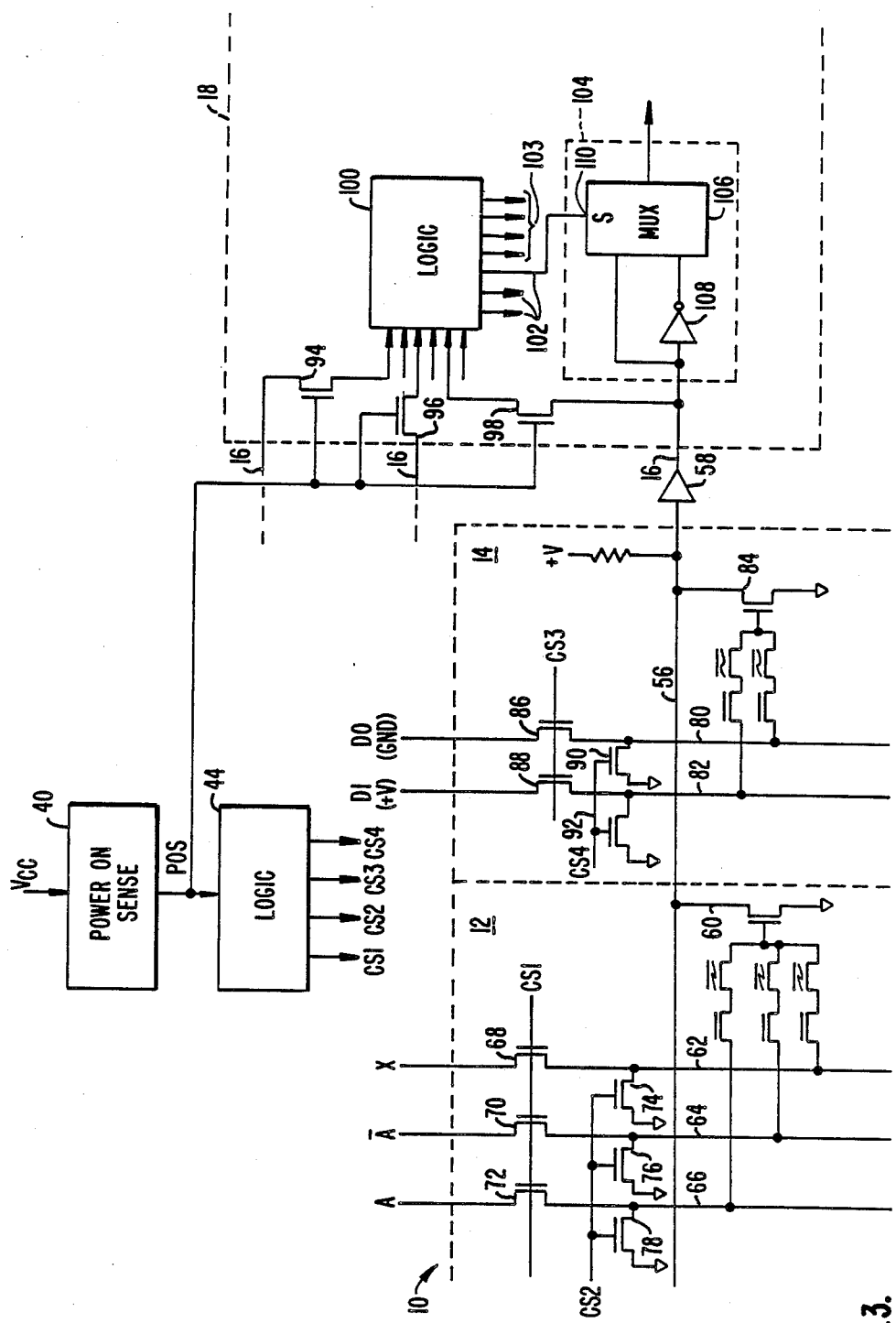
FIG._3.

PROGRAMMING CIRCUIT FOR PROGRAMMABLE LOGIC ARRAY I/O CELL

BACKGROUND

The present invention relates to circuits for programming an output cell in a programmable logic device (PLD) circuit.

A typical PLD has an array of fuses or memory cells which can be programmed to configure the array to provide a number of desired logic functions. Often, this array will be used in conjunction with output cells which may include multiplexers, inverters or other circuitry for handling the outputs of the main fuse or memory array. One or more array outputs may be provided to each output cell. These output cells can have programmable elements in them, such as a multiplexer which can be programmed to select one or the other of its inputs. The programming data for the output cell is typically stored in separate fuses or memory cells. Because the output cells need to be programmed or configured properly prior to readout from the main array, these fuses or memory cells are physically located outside of the main array and next to the other logic elements of the output cell. This complicates the layout of a PLD chip and requires the duplication of sense amplifiers and addressing circuits which are used for the main array.

SUMMARY OF THE INVENTION

The present invention is an improved architecture for programming an output cell (macro cell) in a PLD. The memory cells for the macro cell are stored in the main array itself. Upon power-up, a power-on sense circuit senses the presence of power and enables an architecture portion of the main array while disabling the rest of the main array. The power-on sense signal also enables a path from the output of the array to the macro cell elements to be programmed. When the power-on sense signal is removed a short time after power-up, this path is blocked so that the array outputs continue on their normal path and the architecture portion of the array is disabled while the rest of the array is enabled for normal operation.

By storing the memory cells for the output cell in the array, the layout of the circuit is simplified and less circuitry is required for sense amplifiers and other circuits which are used commonly by elements of the array. The invention allows the placement of these memory cells in the main array by providing a power-on sense circuit which enables this portion of the array while disabling the logic portion of the array during a programming of the output cell architecture. The invention thus insures the architecture will be programmed upon each power-up of the circuit.

In one embodiment, the output cell has six programmable elements which include three multiplexers. Six programming inputs are provided from a logic circuit which decodes the signals of three output lines from the main memory array. These output lines are coupled to this logic circuit by transistors which have their gates connected to a power-on sense circuit. When the power-on sense signal is applied, these transistor switches couple the outputs to the logic circuit for programming. The power-on sense signal itself is a pulse which is provided when the power applied reaches a predetermined level.

Similarly, the power-on sense (POS) pulse is provided to a memory array logic circuit which provides four signals to the memory array. Two of those signals go to the architecture portion of the array and two go to the logic portion of the array. A first signal enables a transistor in each column line to activate that column line. A second signal disables a deactivating transistor which couples each column line to ground when not in use.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a block diagram of a programming circuit for an output cell according to the present invention;

FIG. 2 is a block diagram of a typical output cell; and

FIG. 3 is a combination block and schematic diagram showing a portion of the circuit of FIG. 1 in more detail.

DETAILED DESCRIPTION OF THE PREFERRED EMBODIMENTS

FIG. 1 shows a memory array 10 having a logic portion 12 and an architecture portion 14. The outputs of this array are provided along output lines 16 to macro cells 18. The output of each macro cell is coupled to an I/O pin 20.

Memory array 10 typically contains a crisscrossing pattern of lines which can be connected via programmable "fuses" to produce a variety of logic functions. The fuse is often an actual metal fuse which can be blown or a transistor which is controlled by a programmable memory cell to either provide a connection or not provide a connection. An example of such an array is shown in co-pending application Ser. No. 856,539 entitled "Single Function Programmable Logic Array Circuit", filed Apr. 25, 1986, and incorporated herein by reference.

In one embodiment, each macro cell 18 has the elements shown in FIG. 2. Macro cell 18 is provided with three outputs 16 from the array and also provides two feedback lines 22 to the array. Internally, macro cell 18 contains a J-K latch 24, multiplexers 26, 28 and 30, polarity control elements (PCE) 32, 34 and 36 and a tri-state buffer 38. Each PCE either inverts the signal or leaves the signal unchanged, and can be constructed with a multiplexer having one input inverted and the other not inverted.

These six programmable circuits allow the output cell to perform several different functions. In one state, one of the output lines 16 can simply be provided to output pad 20. In another configuration, output pad 20 can be used as an input pad. In still another configuration, the output of latch 24 can be provided to output pad 20. Other configurations are available as well.

Returning to FIG. 1, it can be seen that it is desirable to program macro cell 18 prior to reading the logic from array 10. This is accomplished with a power-on sense circuit 40 which determines when power line 42 reaches a predetermined level and sends out a power-on sense (POS) pulse. The POS pulse is provided to a logic circuit 44 which provides a pair of control signals 46, 48 to the architecture portion 14 of memory array 10. Another pair of control signals 50, 52 are provided to logic portion 12 of memory array 10. When the POS signal is provided, signal lines 46 and 48 enable portion 14 while lines 50 and 52 disable portion 12. The outputs of architecture portion 14 are then provided on output lines 16 to macro cells 18. These signals are also provided to logic circuits 54 which are enabled by the POS signal. Logic circuits 54 provide the programming inputs to macro cells 18. After programming, the POS pulse disappears, logic circuits 54 are disabled, architecture portion 14 of array 10 is disabled and logic portion 12 of array 10 is enabled. Thereafter, operation of the circuit continues in a normal manner.

FIG. 3 shows the enabling and disabling lines of FIG. 1 in more detail. A single output line 16 is shown which is provided from a term line 56 through a sense amplifier 58. Term line 56 is programmed from a number of column lines as discussed in co-pending application Ser. No. 856,539. A single such connection is shown in FIG. 3 being made through a transistor 60 which is coupled to column lines 62, 64 and 66 through programming transistors. This type of connection is shown in detail in co-pending application Ser. No. 856,623 entitled "Programmable Matrix Circuit", filed Apr. 25, 1986, and incorporated herein by reference. The three column lines 62, 64 and 66 are enabled by a signal CS1 from logic circuit 44 which is provided to three transistors 68, 70 and 72. As can be seen, when CS1 is a logic high, these transistors are enabled, and signals A, $\bar{A}$ and X are allowed to propagate to nodes 66, 64 and 62, respectively. During this time, CS2 is held at zero, turning off transistors 78, 76 and 74. As can be seen, for the column lines to be enabled, CS1 must equal 1 and CS2 must equal 0. When the opposite is the case, these column lines will be disabled by being pulled to ground potential by transistors 74, 76 and 78.

Similarly, in output cell architecture portion 14 of memory array 10, a pair of column lines 80, 82 are coupled via a transistor 84 to term line 56. Similarly, signals CS3 and CS4 enable transistors 86, 88 and 90, 92, respectively. D0 and D1 are preset to ground and +V, respectively. The transistors coupled to transistor 84 are then programmed to connect node 56 (through transistor 84) to either line 80 (ground) or line 82 (+V) to give a logic 0 or 1.

Signals CS1–CS4 are decoded by logic circuit 44 from the POS signal from power-on sense circuit 40. The POS signal is a logic pulse, which when high enables array portion 14 and disables array portion 12. These signals of logic circuit 44 are generated according to the following table:

| POS | CS1 | CS2 | CS3 | CS4 |
|-----|-----|-----|-----|-----|
| 0   | 1   | 0   | 0   | 1   |
| 1   | 0   | 1   | 1   | 0   |

The POS signal is similarly provided to transistors 94, 96 and 98 in output cell 18. These transistors enable output lines 16 to be coupled to a logic circuit 100. Logic circuit 100 provides seven outputs 102, 103 to the various programmable elements of output cell 18. Six output lines 16 are coupled to logic circuit 100, which has seven outputs, three outputs 102 and four outputs 103. Logic circuit 100 includes a 3 to 4 encoder for providing four outputs 103 from three of inputs 16. Outputs 103 control multiplexers 26, 28 and 30 of FIG. 2. Multiplexer 30 requires two control signals because it is a 3 position multiplexer. The outputs 102 of logic circuit 100 are each coupled to a polarity control element 104 of FIG. 3. Polarity control element 104 shown in FIG. 3 consists of a multiplexer 106 and an inverter 108. The output of polarity control element 104 will either be the non-inverted or inverted signal on line 16 depending upon the state of the signal provided to the select input 110 on signal line 102.

The remaining lines 102 are similarly provided to the other programmable elements of output cell 18.

As can be seen, by using the memory cell of transistor 84 in the memory array, the layout of the circuit is simplified since this memory cell is simply another cell in the array. In addition, the need for a separate sense amplifier 58 and separate addressing circuitry is eliminated. If memory cell 84 were contained in output cell 18, such a separate sense amplifier and addressing circuit would be necessary.

As will be understood by those familiar with the art, the present invention may be embodied in other specific forms without departing from the spirit or essential characteristics thereof. For example, a different type of memory array, such as one requiring dedicated OR and AND gates, could be used. Alternately, output cell 18 could be of any configuration having a programmable element in it and any number of such programmable elements could be present. Accordingly, the disclosure of the preferred embodiment of the invention is intended to be illustrative, but not limiting, of the scope of the invention which is set forth in the following claims.

What is claimed is:

1. A programmable logic array circuit comprising:
   an array of programmable memory elements;
   at least one output cell coupled to at least a portion of said array for providing an output from said array to an output terminal, said output cell having at least one programmable circuit with a programming input;
   means for generating an architecture programming signal; and
   means, coupled between said means for generating and at least a first one of said memory elements and responsive to said architecture programming signal, for providing an output of said array to said programming input of said programmable circuit.

2. The circuit of claim 1 wherein said array has a logic portion containing a plurality of said memory elements and coupled to said output cell for normal operation of said circuit and an architecture portion containing at least said first memory element and coupled to said output cell for programming said programmable circuit and further comprising:
   means, responsive to said architecture programming signal, for enabling said architecture portion of said array and disabling said logic portion of said array.

3. The array of claim 1 wherein said means for generating an architecture programming signal is responsive to a power supply level for said array reaching a predetermined threshold value, said architecture programming signal being a pulse provided when said power supply level reaches said value.

4. The array of claim 3 wherein said means for providing an output of said array to said programming input includes a transistor having its gate coupled to receive said architecture programming signal.

5. The array of claim 1 further comprising a plurality of said output cells, each of said output cells being coupled to a portion of said array for providing an output from said array to an output terminal, with each said output cell having a plurality of programmable circuits.

6. The array of claim 1 wherein said programmable circuit comprises a multiplexer and said programming input comprises a select input of said multiplexer.

7. The array of claim 1 further comprising a plurality of said array outputs coupled to each said output cell, and logic means coupled between said array outputs and said programmable circuit for decoding said array outputs for said programming inputs.

8. The array of claim 1 wherein said programmable circuit comprises a polarity control element.

9. The array of claim 1 wherein said programmable circuit comprises a latch.

10. The array of claim 1 wherein said programmable element comprises a tri-state buffer.

11. A programmable logic array circuit comprising:
an array of programmable memory elements with a logic portion containing a plurality of said memory elements for normal operation of said circuit and an architecture portion;
a plurality of output cells, each output cell being coupled to a plurality of output lines from said array for providing an output from said array to an output terminal and including a plurality of programmable circuits, each said programmable circuit having a programming input;
power-on sense means for detecting when a power supply level for said programmable logic array circuit passes a predetermined threshold value and generating a pulse signal;
means, responsive to said pulse signal, for enabling said architecture portion of said array and disabling said logic portion of said array;
a plurality of logic means, coupled between said output lines and said programmable circuits, for decoding signals from said architecture portion on said output lines and providing signals to said programming inputs; and
means, coupled between said power-on sense means and said logic means, for enabling said logic means responsive to said pulse signal.

12. A method for programming an output cell for a programmable logic array, said output cell being coupled to at least a portion of said array for providing an output from said array to an output terminal, said output cell having at least one programmable element with a programming input, comprising the steps of:
programming an architecture element in said array;
detecting a power supply level for said array exceeding a predetermined value;
generating a power-on sense pulse when said power supply level exceeds said predetermined value; and
providing a signal from an output of said architecture element of said array to said programming input subsequent to said power-on sense pulse.

13. The method of claim 12 further comprising the steps of:
dividing said array into a logic portion containing a plurality of memory elements coupled to said output cell for normal operation of said circuit and an architecture portion containing said architecture element;
disabling said logic portion of said array responsive to said power-on sense pulse; and
enabling said architecture portion of said array responsive to said power-on sense pulse.

* * * * *